US007680164B1

(12) United States Patent
Draper et al.

(10) Patent No.: US 7,680,164 B1
(45) Date of Patent: Mar. 16, 2010

(54) CONFIGURABLE LASER DRIVER WITH COMMON ANODE AND COMMON CATHODE OUTPUTS

(75) Inventors: Daniel Draper, Portland, OR (US); Anping Liu, Portland, OR (US); Maurice M. Reintjes, Beaverton, OR (US); Jerome Garez, Beaverton, OR (US); Kenneth Tsui, Beaverton, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 1296 days.

(21) Appl. No.: 11/141,214

(22) Filed: May 31, 2005

(51) Int. Cl.
*H01S 3/00* (2006.01)
(52) U.S. Cl. ............ 372/38.02; 372/29.02; 372/29.021; 372/38.1; 372/38.03; 372/38.07
(58) Field of Classification Search ............ 372/29.021, 372/38.1, 38.02, 38.09, 29.02, 38.03, 38.07
See application file for complete search history.

(56) References Cited

U.S. PATENT DOCUMENTS

| 6,324,197 B1 * | 11/2001 | Suda ........................ 372/38.01 |
| 6,465,967 B2 * | 10/2002 | Tsujikawa et al. ......... 315/169.1 |
| 6,920,163 B2 * | 7/2005 | Ishii ......................... 372/38.02 |
| 2001/0020670 A1 * | 9/2001 | Hyoga ........................ 250/205 |
| 2003/0035456 A1 * | 2/2003 | Lin et al. ...................... 372/50 |
| 2003/0138011 A1 * | 7/2003 | Doil ......................... 372/38.02 |
| 2005/0129075 A1 * | 6/2005 | Anderson et al. ......... 372/38.02 |

OTHER PUBLICATIONS

Author Unknown, "MAX 3286-MAX3289/MAX3296-MAX3299", Data Sheet Pub'd by Maxim Int. Prod., Dec. 1999.

* cited by examiner

*Primary Examiner*—Minsun Harvey
*Assistant Examiner*—Yuanda Zhang
(74) *Attorney, Agent, or Firm*—Thomas, Kayden, Horstemeyer & Risley, LLP

(57) ABSTRACT

Various laser drivers and methods are provided. In one embodiment, a laser driver is provided that comprises a laser driver circuit having a common anode portion and a common cathode portion. The common anode portion and the common cathode portion are each configured to drive a laser. Also, the laser driver includes a control input to alternatively enable one of the common anode portion and the common cathode portion to drive the laser.

21 Claims, 4 Drawing Sheets

US 7,680,164 B1

CONFIGURABLE LASER DRIVER WITH COMMON ANODE AND COMMON CATHODE OUTPUTS

BACKGROUND

Lasers employed in communications systems and networks include lasers operated in a common anode configuration or a common cathode configuration. Such lasers may employ monitor photodiodes to obtain feedback as to the strength of the laser at any given time. A laser in a common anode configuration is generally constructed with the anode of the laser and the cathode of the monitor photodiode coupled together and to the case of the circuit package used for heat sinking. A laser in a common cathode configuration is generally constructed with the cathode of the laser and the anode of the monitor photodiode coupled together and to the case of packaging as well. Lasers in both common anode and common cathode configurations are employed in various applications. Lasers in common anode configurations may generate laser radiation of greater magnitude and may be employed, for example, where greater laser power is needed such as in data communications applications involving transmission over optical fiber. Lasers in common cathode configurations may be employed in applications with laser power of lesser magnitudes such as is the case, for example, with Vertical Cavity Surface Emitting Lasers (VCSELs).

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
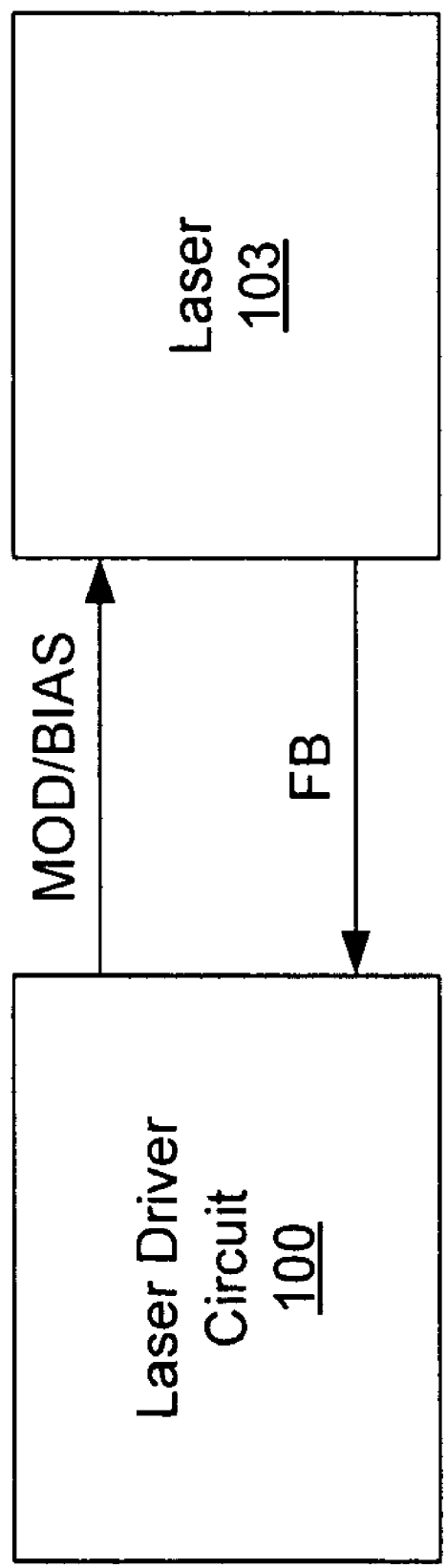
FIG. 1 is a block diagram of a laser and laser driver circuit according to an embodiment of the present invention.

Turning then to FIG. 1, shown is a block diagram of a laser driver circuit 100 that is in data communication with a laser 103. The laser 103 may be operated in a common anode configuration or a common cathode configuration. The laser driver circuit 100 generates modulation and bias currents (MOD/BIAS) that are applied to and power the laser 103. A portion of the radiation generated by the laser 103 is directed to a photodiode. In response thereto, the photodiode generates a feedback current signal (FB). This feedback current signal (FB) is applied to the laser driver circuit 100 and, in turn, laser driver circuit 100 adjusts or otherwise maintains the bias current to keep the feedback current signal (FB) at a constant average current for the optimal performance of the laser 103. According to one embodiment, the laser driver circuit 100 is compatible with lasers in either a common anode configuration or a common cathode configuration. In this respect, the laser driver circuit 100 is configurable to drive a laser 103 of either type based upon a control input to the laser driver circuit 100. Consequently, the laser driver circuit 100 may be manufactured at less cost due to economies of scale that are gained since the laser driver circuit 100 can be employed to drive lasers 103 in either configuration. Specifically, the number of applications within which the laser driver circuit 100 may be employed is increased significantly since the laser driver circuit 100 may be employed to drive lasers 103 in either configuration. Also, the laser driver circuit 100 can advantageously reduce inventory costs for a module manufacturer by allowing them to use the same laser driver for more than one laser application.

Figure 2:
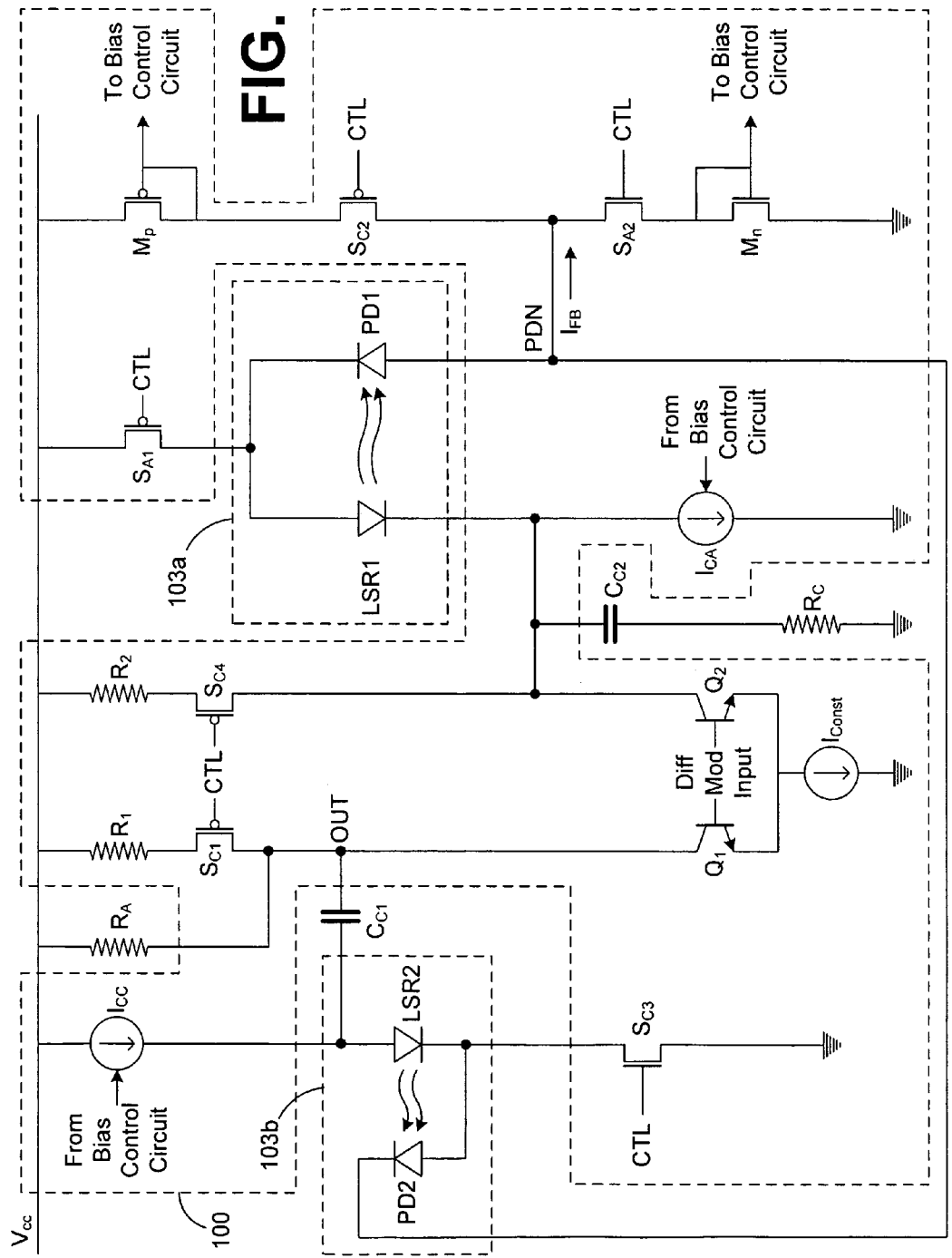
FIG. 2 is a schematic of the laser driver circuit of FIG. 1 according to an embodiment of the present invention.

With reference to FIG. 2, shown is a schematic that illustrates one example of a laser driver circuit 100 according to an embodiment of the present invention. The laser driver circuit 100 may be employed to drive a laser LSR1 in a common anode configuration 103a or a laser LSR2 in a common cathode configuration 103b as shown. In this respect, only one of the lasers LSR1 or LSR2 is coupled to the laser driver circuit 100 at one time even though both are shown in FIG. 2. The laser driver circuit 100 includes a conductor to which a voltage $V_{CC}$ is applied to power the laser driver circuit 100. In this respect, the voltage $V_{CC}$ may be generated by a power supply external to the laser driver circuit 100 as can be appreciated.

The laser driver circuit 100 also includes a common cathode portion and a common anode portion. Some of the circuit elements of the laser driver circuit 100 are common to both the common cathode portion and the common anode portion as will be described. The laser driver circuit 100 includes a plurality of switching elements $S_{A1}$, $S_{A2}$, $S_{C1}$, $S_{C2}$, $S_{C3}$, and $S_{C4}$. The switching elements $S_{A1}$, $S_{A2}$, $S_{C1}$, $S_{C2}$, $S_{C3}$ and $S_{C4}$ are operatively coupled to and are manipulated by one or more control inputs CTL to the laser driver circuit 100 to alternatively enable either the common anode portion or the common cathode portion of the laser driver circuit 100. In this respect, the switching elements $S_{A1}$, $S_{A2}$, $S_{C1}$, $S_{C2}$, and $S_{C3}$, and $S_{C4}$ selectively complete predefined portions of the laser driver circuit 100 in response to the control input(s) CTL in order to enable the operation of either the common anode portion or the common cathode portion. In addition, switching elements $S_{C3}$ and $S_{A1}$ facilitate the shutdown of the lasers LSR1 or LSR2, respectively, in the event of a fault condition.

The control input CTL may actually be the same signal applied to each of the switching elements $S_{A1}$, $S_{A2}$, $S_{C1}$, $S_{C2}$, $S_{C3}$, and $S_{C4}$ or the control input CTL may differ in its application to a given two or more of the switching elements $S_{A1}$, $S_{A2}$, $S_{C1}$, $S_{C2}$, $S_{C3}$, and $S_{C4}$. In this respect, the control input CTL may be inverted or altered in some other manner by appropriate circuitry, etc. By manipulating the switching elements $S_{A1}$, $S_{A2}$, $S_{C1}$, $S_{C2}$, $S_{C3}$, and $S_{C4}$, the control input CTL alternatively enables one of the common anode portion or the common cathode portion to drive the respective laser 103a or 103b. Also, a separate control input may be applied to switching elements $S_{C3}$ and $S_{A1}$ in order to facilitate the shutdown of a respective laser LSR1 or LSR2.

In one embodiment, each of the switching elements $S_{A1}$, $S_{A2}$, $S_{C1}$, $S_{C2}$, $S_{C3}$, and $S_{C4}$ may comprise a solid state switch such as a transistor, etc. Specifically, MOSFET transistors or other types of transistors may be employed. Alternatively, other types of switching elements may be employed such as switches or other elements.

In one embodiment, the switching element $S_{A1}$ is coupled between the voltage source $V_{CC}$ and both the anode of the laser LSR1 and the photodiode PD1 of the common anode configuration 103a. The cathode of the laser LSR1 is coupled to current source $I_{C4}$, which in turn is coupled to ground. The anode of the photodiode PD1 is coupled to switching elements $S_{C2}$ and $S_{A2}$ as shown. Also, the cathode of the photodiode PD2 is also coupled to the switching elements $S_{C2}$ and $S_{A2}$. Thus, the feedback signal received from the photodiodes PD1 or PD2 of the common anode or common cathode configurations 103a or 103b are received at a common photodiode input that comprises a common node PDN. The switching elements $S_{C2}$ and $S_{A2}$ are coupled to mirroring transistors $M_p$ and $M_n$, respectively. The mirroring transistors $M_p$ and $M_n$ supply current to a bias control circuit as shown.

The laser driver circuit 100 includes modulation transistors $Q_1$ and $Q_2$. A differential modulation input is applied to the bases of the modulation transistors $Q_1$ and $Q_2$ to drive a respective one of the lasers LSR1 or LSR2, depending upon which configuration for which the laser driver circuit 100 is employed. The cathode of the laser LSR1 is also coupled to the modulation transistor $Q_2$ as shown. Also coupled to the modulation transistor $Q_2$ when the laser driver circuit 100 is employed in the common cathode configuration 103b is an external coupling capacitor $C_{C2}$ in series with resistor $R_C$.

The laser driver circuit 100 also includes a current source $I_{CC}$ that is coupled between the voltage $V_{CC}$ and the anode of the laser LSR2 of the common cathode configuration 103b. The switching element $S_{C3}$ couples the cathode of the laser LSR2 to ground. Also, the coupling capacitor $C_{C1}$ couples the anode of the laser LSR2 to an output node OUT of the laser driver circuit 100. A modulation transistor $Q_1$ is coupled to the external coupling capacitor $C_{C1}$ when the laser driver circuit 100 is employed in the common cathode configuration 103b. Also, the modulation transistors $Q_1$ and $Q_2$ are coupled to the constant current source $I_{Const}$, where $I_{Const}$ can be provided directly or by other means of control or feedback. The differential modulation input employed to drive the modulation transistors $Q_1$ and $Q_2$ may embody data to be transmitted as can be appreciated. The differential modulation input applies opposing signals to the respective bases of the modulation transistors $Q_1$ and $Q_2$ as can be appreciated.

Switching elements $S_{A1}$ and $S_{C3}$ described above provide a redundant shutdown of the laser current upon an occurrence of a fault condition. For example, a fault condition might be that excessive current flows through a laser LSR1 or LSR2, resulting in laser output power that could exceed eye-safe conditions. Situations that could create such a fault condition include, for example, shorting the cathode of LSR1 to ground or shorting the anode of LSR2 to $V_{CC}$. If such a fault condition were to occur, the laser driver circuit 100 includes circuitry that detects the fault and changes the state of control signal CTL such that switch $S_{A1}$ is opened for common anode operation or switch $S_{C3}$ is opened for common cathode operation, thereby preventing excessive current flow through the laser. As can be appreciated, with proper control circuitry, switching element $S_{C3}$ could also act to provide the $I_{CA}$ laser bias current for common anode configurations and switching element $S_{A1}$ could act to provide the $I_{CC}$ laser bias current for common cathode configurations, thereby improving the level of integration and further reducing device cost.

The modulation transistors $Q_1$ and $Q_2$ are circuit components that are common to both the common anode and common cathode portions of the laser driver circuit 100. The modulation transistors $Q_1$ and $Q_2$ are driven by the differential modulation input signal to establish a modulated current through a respective one of the lasers LSR1 or LSR2. Thus, the differential modulation input signal is a common laser modulation input that modulates the operation of a laser LSR1 or LSR2 that is driven by either the common anode portion or the common cathode portion of the laser driver circuit 100. The differential modulation input signal causes the respective laser LSR1 or LSR2 to generate laser light output that represents the data embodied in the modulation signal for transmission, for example, across optical fiber or other optical signal pathway.

The laser driver circuit 100 also includes resistors $R_1$ and $R_2$ that couple the voltage $V_{CC}$ to the switching elements $S_{C1}$ and $S_{C4}$. The switching elements $S_{C1}$ and $S_{C4}$ are, in turn, coupled to the modulation transistors $Q_1$ and $Q_2$, respectively. In one embodiment, the resistors $R_1$ and $R_2$ are equal to each other. The value of the resistors $R_1$ and $R_2$ determines the magnitude range of the current that flows through the laser LSR2 as will be described. In addition, when the laser driver circuit 100 is employed in the common anode configuration, an external resistor $R_A$ is coupled between the source voltage $V_{CC}$ and the modulation transistor $Q_1$.

When the common cathode portion of the laser driver circuit 100 is enabled, the output node OUT is coupled to the coupling capacitor $C_{C1}$. In one embodiment, the laser driver circuit 100 is embodied in an integrated circuit. In this respect, the coupling capacitor $C_{C1}$ is external to the laser driver circuit 100.

The current source $I_{CC}$ supplies bias current to the laser LSR2 during its operation. A portion of the bias current supplied by the current source $I_{CC}$ is a laser threshold current that is a minimum amount of current necessary to ensure that the laser stays in an operational state. The current source $I_{CC}$ also provides a further portion of current to maintain a constant average current applied to the laser LSR2. In this respect, the current source $I_{CC}$ generates a level of current that falls in the middle of the range of currents that are employed to generate an optical "0" or an optical "1".

The current source $I_{CA}$ is also employed to maintain the proper bias current in the laser LSR1. A portion of the bias current supplied by the current source $I_{CA}$ is a laser threshold current that is a minimum amount of current necessary to ensure that the laser stays in an operational state. In addition, the current source $I_{CA}$ generates a further amount of current to cause the laser LSR1 to generate an optical "0". This further amount of current is a portion of the modulation current applied in addition to the laser threshold current. If the combination of bias and modulation current applied to either one of the lasers LSR1 or LSR2 falls below the laser threshold current, then greater current would have to be applied to the lasers LSR1 or LSR2 to place them back into the operational state. This would introduce an unwanted delay in the operation of the lasers LSR1 or LSR2. Where data information is transmitted at frequencies in the megahertz range or greater, such a delay would be very costly and potentially result in a significant loss of data. As a result, the current sources $I_{CC}$ and $I_{CA}$ maintain a proper bias current in the lasers LSR1 or LSR2, depending upon whether a common anode or common cathode configuration 103a or 103b is employed in conjunction with the laser driver circuit 100.

Figure 3:
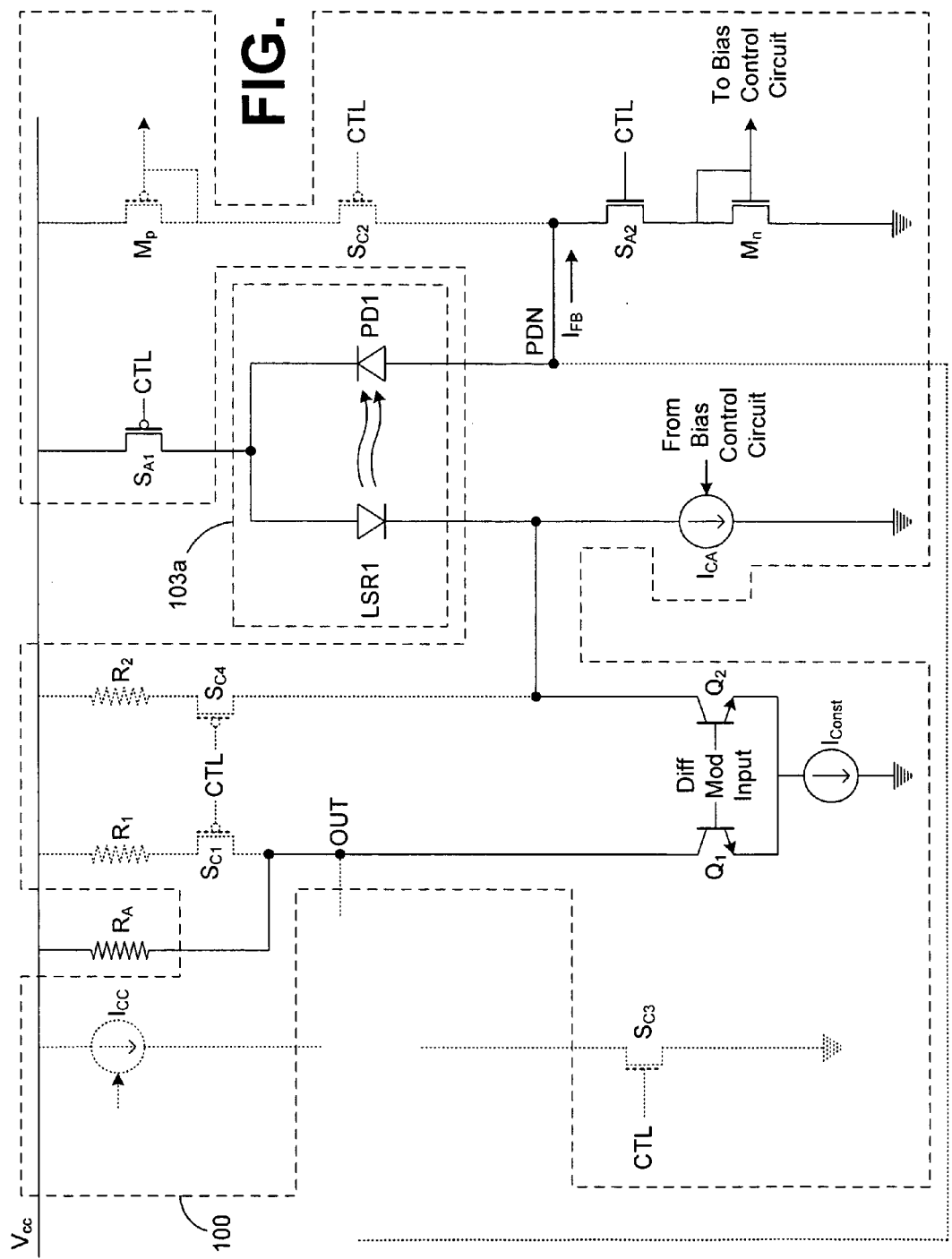
FIG. 3 is a schematic that illustrates a common anode portion of the laser driver circuit of FIG. 2 according to an embodiment of the present invention.

Referring next to FIG. 3, shown is a schematic that illustrates the common anode portion of the laser driver circuit 100 when completed or enabled. The following is a discussion of the operation of the common anode portion of the laser driver circuit 100 according to one embodiment of the present invention.

To begin, the control input(s) CTL is/are set at a value so that the switching elements $S_{A1}$ and $S_{A2}$ are closed, and the switching elements $S_{C1}$, $S_{C2}$, $S_{C3}$, and $S_{C4}$ are open. As a consequence of the state of the switching elements as described, only the common anode portion of the laser driver circuit 100 is enabled. In this respect, the manipulation of the switching elements selectively completes the common anode portion of the laser driver circuit 100. The voltage source $V_{CC}$ is coupled directly to the anode of the laser LSR1 and the photodiode PD1 through the switching element $S_{A1}$ (closed). The current source $I_{CA}$ establishes an amount of current through the laser LSR1 so that the laser LSR1 generates an optical "0". In this respect, the current generated by the current source $I_{CA}$ is the bias current that includes the laser threshold current and the amount of current above the laser threshold current to generate the optical "0". If the current generated by the current source $I_{CA}$ falls below the laser threshold current, then the laser LSR1 will not be able to respond to modulating current until the laser threshold current is established as was described above.

By applying a differential modulating input signal to the modulation transistors $Q_1$ and $Q_2$, a modulated current is established through the laser LSR1. In particular, the differential modulating input causes the modulating transistors $Q_1$ and $Q_2$ to alternatively close and open. When $Q_1$ is open, $Q_2$ is closed and vice versa. When $Q_2$ is closed and $Q_1$ is open, the constant current source $I_{Const}$ generates a modulating current that flows through the laser LSR1. In this respect, the modulated current is added to the current generated by the current source $I_{CA}$, thereby increasing or decreasing the optical output power of laser LSR1 to create an optical "1" or optical "0", depending upon the magnitude of the modulated current at a given instant. When $Q_1$ is closed and $Q_2$ is open, only the current established by the current source $I_{CA}$ flows through the laser LSR1. The current generated by the constant current source $I_{Const}$ flows through the external resistor $R_A$. In this respect, $R_A$ is specified so as to approximately equal the total resistance of the laser LSR1. Consequently, the constant current source $I_{Const}$ is maintained at a constant level and is switched between the laser LSR1 and the resistor $R_A$, thereby establishing a modulated current in the laser LSR1.

Thus, the common anode portion of the laser driver circuit 100 is configured to establish both a bias current and a modulated current in the laser LSR1. A portion of the light generated by the laser LSR1 falls on the photodiode PD1 that generates a feedback current $I_{FB}$. The feedback current $I_{FB}$ is applied to the mirror transistor $M_n$ through switching element $S_{A2}$. In this manner, a signal is generated that is applied to bias control circuitry. The bias control circuitry in turn generates a signal that controls the operation of the current source $I_{CA}$ to maintain a proper zero level current through the laser LSR1. In this respect, the bias control circuitry is configured to maintain a desired constant average current through the laser LSR1 for successful data transmission by the laser LSR1 and to establish an optical "0" as described.

The common anode portion of the laser driver circuit 100 is capable of driving the laser LSR1 in the common anode configuration 103a with relatively high current as opposed to a laser LSR2 driven in the common cathode configuration 103b as will be described.

Figure 4:
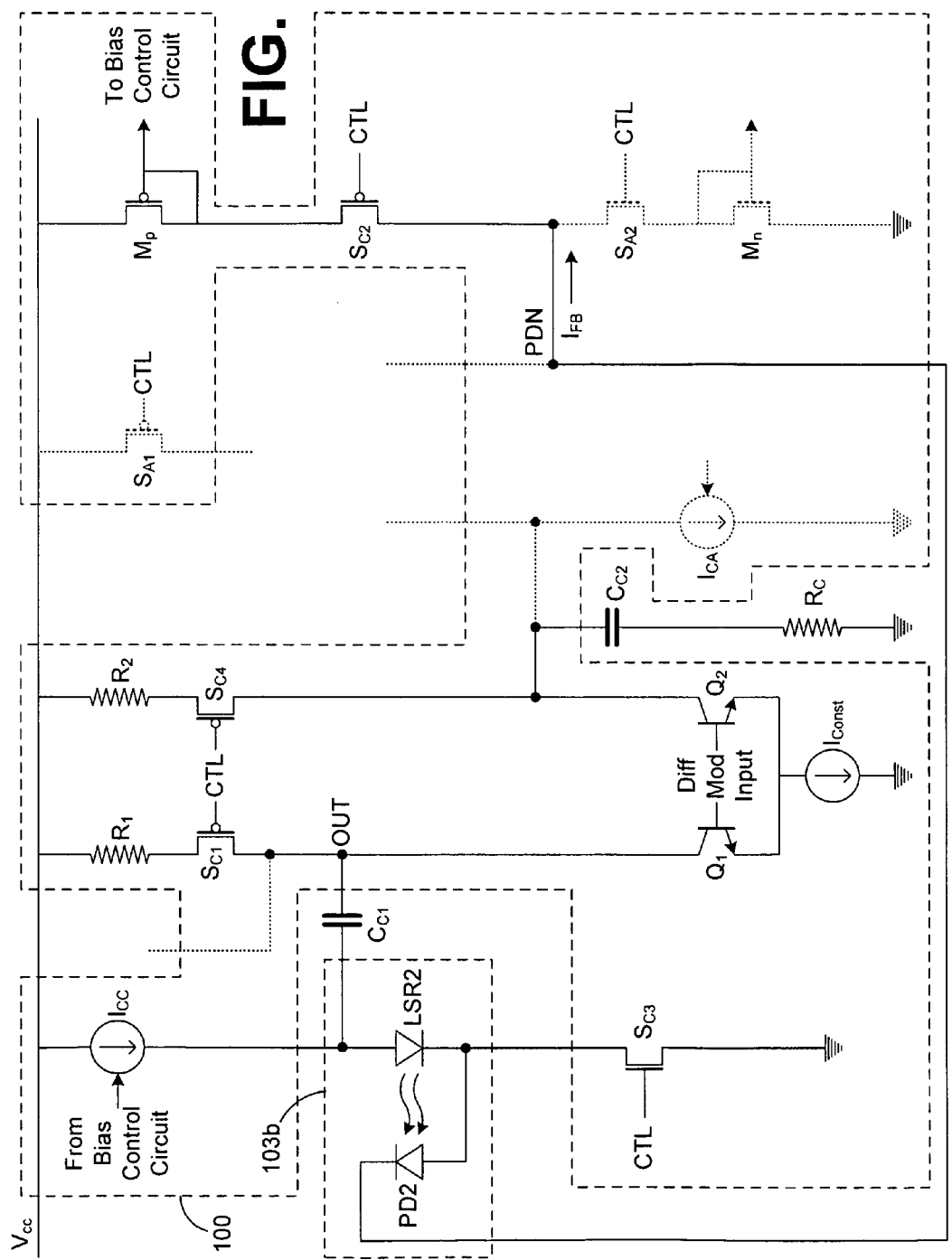
FIG. 4 is a schematic that illustrates a common cathode portion of the laser driver circuit of FIG. 2 according to an embodiment of the present invention.

Turning then, to FIG. 4, shown is a schematic that illustrates the common cathode portion of the laser driver circuit 100 when enabled. The following is a discussion of the operation of the common cathode portion of the laser driver circuit 100 according to one embodiment of the present invention.

To begin, the control input CTL is set at a value so that the switching elements $S_{C1}$, $S_{C2}$, $S_{C3}$, and $S_{C4}$ are closed, and the switching elements $S_{A1}$ and $S_{A2}$ are open. As a consequence of the state of the switching elements as described, only the common cathode portion of the laser driver circuit 100 is enabled. In this respect, the manipulation of the switching elements selectively completes the common cathode portion of the laser driver circuit 100. The voltage source $V_{CC}$ is coupled directly to the current source $I_{CC}$ and the resistors $R_1$ and $R_2$. Given that the switching element $S_{C1}$ and $S_{C4}$ are in a closed state, then current may be established through the resistors $R_1$ and $R_2$ when an appropriate voltage is applied to the base of the modulation transistors $Q_1$ and $Q_2$ as can be appreciated. Also, given that the switching element $S_{C3}$ is in a closed state, the current source $I_{CC}$ flows through the laser LSR2 of the common cathode laser 103b as will be described. The current source $I_{CC}$ generates an amount of current that would drive the laser LSR2 to generate a light output that is in the midrange between and optical "0" and an optical "1". In this respect, the current source $I_{CC}$ generates a constant average current applied to the laser LSR2.

In addition, in a typical situation, the modulation signal applied to the modulation transistor $Q_1$ is a relatively high frequency data signal. While the coupling capacitor $C_{C1}$ acts as an open circuit for DC current and the bias current generated by the current source $I_{CC}$, it acts as a short for high frequency signals. Consequently, for purposes of high frequency signals, the common cathode portion presents a parallel circuit in which the resistance of the laser LSR2 is in parallel with the resistor $R_1$ when the modulation transistor $Q_1$ is closed and the modulation transistor $Q_2$ is open. In this state, the constant current source $I_{Const}$ robs current generated by the current source $I_{CC}$, thereby reducing the current that flows through the laser LSR2. This reduced current flow causes the laser LSR2 to generate an optical "0".

When the modulation transistor $Q_1$ is open and the modulation transistor $Q_2$ is closed, then the common cathode portion presents a parallel circuit in which the resistance $R_2$ is in parallel with the external coupling capacitor $C_{C2}$ and the external resistance $R_C$. In this respect, the coupling capacitor $C_{C2}$ mimics the coupling capacitor $C_{C1}$ and the resistance $R_C$ mimics the total resistance associated with the laser LSR2. Also, the capacitor $C_{C1}$ discharges, thereby generating current that flows through the laser LSR2. Also, current flows through the resistor $R_1$ through the coupling capacitor $C_{C1}$ and through the laser LSR2. Also, all of the current generated by the current source $I_{CC}$ flows through the laser LSR2. As a result, the additional current flowing through the laser LSR2 above the average current from the current source $I_{CC}$ causes the laser LSR2 to generate an optical "1".

As the differential modulation input signal switches the modulation transistors $Q_1$ and $Q_2$ according to a data signal to be transmitted, the constant current source $I_{Const}$ either robs current from the current source $I_{CC}$ or pulls current through $R_2$ and $R_C$. As such, a component of the current generated by the current source $I_{CC}$ is a modulation current applied to the laser LSR2 and another component of the current generated by the current source $I_{CC}$ is a threshold current applied to the laser LSR2. Also, the modulation current also comprises the current supplied by the coupling capacitor $C_{C1}$ and through the resistor $R_1$ as described above.

The magnitude of the modulation current that flows through the laser LSR2 and the resistor $R_1$ depends upon the relative values of the resistance of the resistor $R_1$ and the resistance inherent in the laser LSR2. Also, note that control signal CTL could also be configured to open switch $S_{C1}$ in the common cathode configuration. This would allow laser driver circuit 100 to modulate higher-current lasers similar to that supported in common anode configuration when node OUT is DC-coupled to the anode of laser LSR2.

Thus, the common cathode portion of the laser driver circuit 100 is configured to establish both a bias current and a modulated current in the laser LSR2. A portion of the light generated by the laser LSR2 falls on the photodiode PD2 that generates a feedback current $I_{FB}$. The feedback current $I_{FB}$ is applied to the mirror transistor $M_p$ through switching element $S_{C2}$. In this manner, a signal is generated that is applied to bias control circuitry. The bias control circuitry in turn generates a signal that controls the operation of the current source $I_{CC}$ to maintain a proper average current through the laser LRS2. In this respect, the bias control circuitry is configured to maintain the desired constant average current through the laser LSR2 for successful data transmission by the laser LSR2.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A laser driver, comprising:
   a laser driver circuit having a common anode portion and a common cathode portion, wherein the common anode portion and the common cathode portion are each configured to drive a laser, the common anode portion includes a common anode configuration driver circuit, and the common cathode portion includes a common cathode configuration driver circuit; and
   a control input to alternatively enable one of the common anode portion and the common cathode portion to drive the laser.

2. The laser driver of claim 1, wherein the laser driver circuit further comprises at least one circuit element that is common to both the common anode portion and the common cathode portion.

3. The laser driver of claim 1, further comprising a plurality of switching elements that alternatively enable the common anode portion or the common cathode portion by selectively completing predefined portions of the laser driver circuit.

4. The laser driver of claim 3, wherein each of the switching elements further comprises a solid state switch.

5. The laser driver of claim 1, further comprising at least one common laser modulation input that modulates the operation of the laser driven by either the common anode portion or the common cathode portion.

6. The laser driver circuit of claim 1, further comprising a common photodiode input to receive a feedback from the laser driven by the common anode portion or the common cathode portion.

7. The laser driver circuit of claim 1, wherein the common cathode portion and the common anode portion are each configured to establish both a bias current and a modulated current in the laser.

8. The laser driver circuit of claim 1, wherein the common cathode portion is configured to establish a modulated current through a coupling capacitor.

9. The laser driver circuit of claim 8, wherein the coupling capacitor is external to the laser driver circuit.

10. The laser driver circuit of claim 1, wherein the laser driver circuit is embodied in an integrated circuit.

11. A method for driving a laser with a laser driver circuit having a common anode portion and a common cathode portion, wherein the common anode portion includes a common anode configuration driver circuit, and the common cathode portion includes a common cathode configuration driver circuit, the method comprising the steps of:
    applying a control input to the laser driver circuit to alternatively enable the common anode portion or the common cathode portion; and
    generating a bias current and a modulating current in the laser with the enabled one of the common anode portion and the common cathode portion.

12. The method of claim 11, further comprising the step of manipulating a plurality of switching elements in the laser drive circuit to selectively complete the common anode portion or the common cathode portion of the laser driver circuit in response to the control input.

13. The method of claim 11, further comprising the step of manipulating at least one switching element to effect a shutdown of the laser due to a fault condition.

14. The method of claim 12, wherein the step of manipulating the plurality of switching elements further comprises the step of manipulating a plurality of solid state switches.

15. The method of claim 11, further comprising the step of modulating the laser with at least one laser modulation input that is common to both the common anode portion and the common cathode portion.

16. The method of claim 11, further comprising coupling a photodiode feedback of the laser to a node that is common to both the common anode portion and the common cathode portion.

17. The method of claim 11, further comprising the step of establishing the modulated current with the common cathode portion through a coupling capacitor.

18. The method of claim 11, further comprising the step of embodying the laser driver circuit in an integrated circuit.

19. A laser driver, comprising:
    a laser driver circuit having a common anode portion and a common cathode portion, wherein the common anode portion and the common cathode portion are each configured to drive a laser, the common anode portion includes a common anode configuration driver circuit, and the common cathode portion includes a common cathode configuration driver circuit; and
    means for alternatively enabling one of the common anode portion and the common cathode portion to drive the laser.

20. The laser driver of claim 19, wherein the means for alternatively enabling further comprises a plurality of switching elements that alternatively enable the common anode portion or the common cathode portion by selectively completing predefined portions of the laser driver circuit.

21. The laser driver of claim 19, wherein the laser driver circuit further comprises at least one circuit element that is common to both the common anode portion and the common cathode portion.

* * * * *